United States Patent
Panasik et al.

(10) Patent No.: US 6,515,605 B2
(45) Date of Patent: Feb. 4, 2003

(54) BASE STATION HAVING HIGH SPEED, HIGH RESOLUTION, DIGITAL-TO-ANALOG CONVERTER WITH OFF-LINE SIGMA DELTA CONVERSION AND STORAGE

(75) Inventors: Carl M. Panasik, Garland, TX (US); T. R. Viswanathan, Dallas, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 09/846,429

(22) Filed: Apr. 30, 2001

(65) Prior Publication Data

US 2002/0159417 A1 Oct. 31, 2002

(51) Int. Cl.[7] .................................................. H03M 3/00
(52) U.S. Cl. ...................................... 341/143; 341/144
(58) Field of Search ................................. 341/143, 144; 370/310

(56) References Cited

U.S. PATENT DOCUMENTS

| | | | |
|---|---|---|---|
| 4,901,077 A | 2/1990 | Christopher | 341/143 |
| 5,079,551 A | 1/1992 | Kimura et al. | 341/143 |
| 5,313,205 A | 5/1994 | Wilson | 341/144 |
| 5,701,106 A | 12/1997 | Pikkarainen et al. | 332/100 |
| 5,712,635 A | 1/1998 | Wilson et al. | 341/144 |
| 5,751,705 A * | 5/1998 | Sato | 370/335 |
| 5,786,779 A | 7/1998 | Chun et al. | 341/61 |
| 5,815,102 A | 9/1998 | Melanson | 341/143 |
| 5,920,273 A | 7/1999 | Hirano | 341/144 |
| 5,952,947 A | 9/1999 | Nussbaum et al. | 341/143 |
| 6,072,364 A * | 6/2000 | Jeckeln et al. | 330/149 |
| 6,108,315 A * | 8/2000 | Freeburg et al. | 370/310 |
| 6,154,161 A * | 11/2000 | Leme et al. | 341/143 |

OTHER PUBLICATIONS

"A Second–Order Double–Sampled Delta–Sigma Modulator Using Individual–Level Averaging", Chuc K. Thanh, et al., 1997 IEEE Journal of Solid–State Circuits, vol. 32, No. 8, Aug. 1997, pp. 1269–1273.

* cited by examiner

Primary Examiner—Peguy JeanPierre
(74) Attorney, Agent, or Firm—Ronald O. Neerings; Wade James Brady, III; Frederick J. Telecky, Jr.

(57) ABSTRACT

A wireless base station having an improved DAC operable at higher speed than heretofore achievable which exploits the sigma-delta principle in a different way. More particularly, the invention comprises a base station 300 that implement a digital-to-analog conversion circuit (105) including a storage means (110), such as a read only memory, for storing delta-sigma analog sequences corresponding to all possible values of a digital input (106) coupled to a plurality of one-bit digital to analog converters (120, 122, 124, 126). Each of the digital-to-analog converters (120, 122, 124, 126) are clocked by multi-phase clocks, such that each phase applied to each one of the digital-to-analog converters (120, 122, 124, 126) is delayed with respect to one another by the oversampling period. An summer is coupled to each digital-to-analog converter (120, 122, 124, 126) for summing each output from each digital-to-analog converter (120, 122, 124, 126) to generate an analog output. Hereby, the digital-to-analog conversion circuit (105) according to the invention emulates a delta-sigma digital-to-analog converter having both high speed and high resolution.

24 Claims, 7 Drawing Sheets

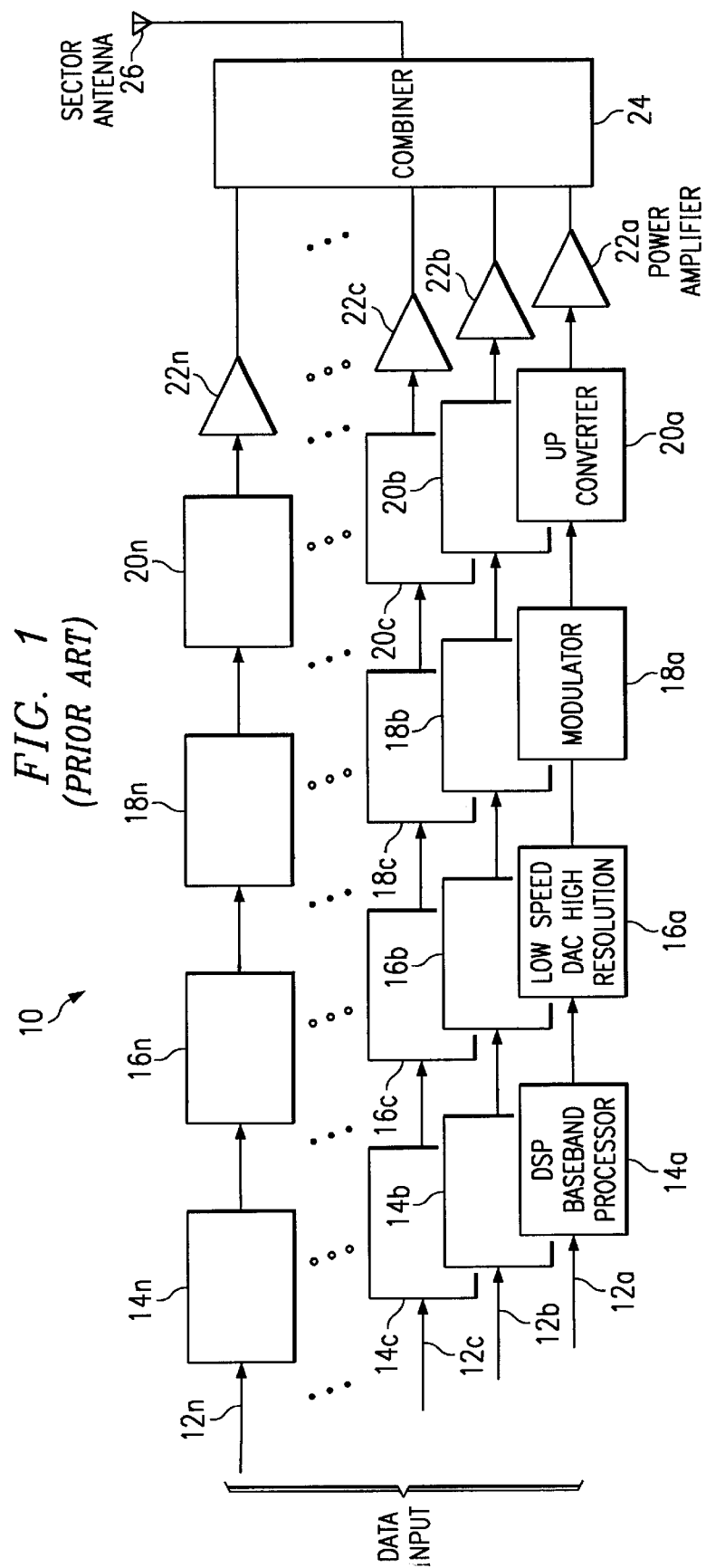
FIG. 1 (PRIOR ART)
FIG. 2a (PRIOR ART)
FIG. 2b (PRIOR ART)
FIG. 2c (PRIOR ART)

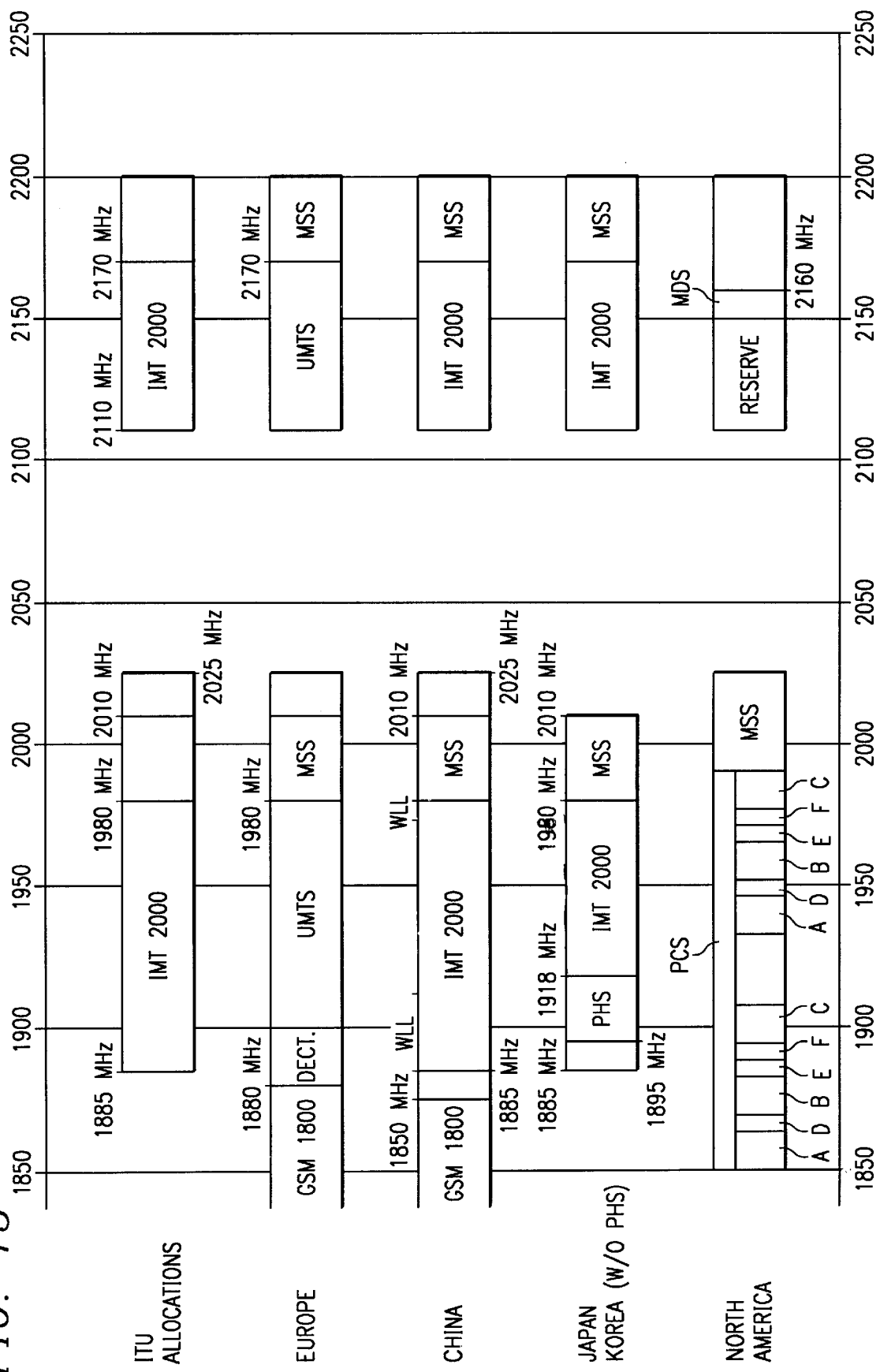

BASE STATION HAVING HIGH SPEED, HIGH RESOLUTION, DIGITAL-TO-ANALOG CONVERTER WITH OFF-LINE SIGMA DELTA CONVERSION AND STORAGE

CROSS REFERENCE TO RELATED APPLICATIONS

This invention is related to copending applications: Ser. No. 09/846,846, filed Apr. 30, 2001; Ser. No. 09/846,935, filed Apr. 30, 2001; and Ser. No. 09/846,429, filed Apr. 30, 2001, all of which are herein incorporated by reference.

TECHNICAL FIELD OF THE INVENTION

This invention pertains to a base station that incorporates a digital-to-analog (D/A) converter for performing high speed and high-resolution digital-to-analog conversion using an oversampling principle.

BACKGROUND OF THE INVENTION

Cellular base stations, located at the center or on the edge of a coverage region or cell, are fixed stations within a wireless communication system used for radio communication with mobile stations. They comprise numerous radio channels and include a transmitter and receiver antenna mounted on a tower. A typical cellular base station specification requires a 16-bit DAC with an output bandwidth of 200 MHz and a spurious-free dynamic range on the order of about 100 dB. Though cost and power limitations may not be as critical where base station usage is contemplated, high resolution operation using oversampling is nevertheless complicated at increased speed. In particular, for sampling rates of approximately 400M samples per second (Nyquist sampling of a signal band-limited to 200 MHz), performing digital-to-analog conversions in real time using oversampling becomes extremely difficult and consumes vast amounts of power. And, for high speed applications, trading resolution for increase in processing speed is not an option. Thus, there is a need for a cellular base station having a high speed, high resolution digital-to-analog conversion apparatus and method.

Digital-to-analog conversion refers to the process of converting discrete digital signals into a continuous-time range of analog signals. The conversion of analog signals to digital signals and vice versa is often used in order to interface real world systems, many of which monitor continuously varying analog signals, with digital systems that read, store, interpret, manipulate and otherwise process the discrete values of sampled analog signals.

Sigma-delta modulation (sometimes called "delta-sigma modulation") provides a high resolution digital-to-analog conversion solution. It incorporates a noise-shaping technique whereby the noise of a quantizer (often 1-bit) operating at a frequency much greater than the bandwidth is moved to high frequencies not of interest in the output signal. A filter after the quantizer removes the out-of-band noise. The resulting system synthesizes a high resolution data converter, but is constructed from low resolution building blocks. Since sigma-delta DACs provide for oversampling digital to analog conversion through the sampling of signals at very high frequencies (i.e., sampling at rates much greater than the Nyquist rate), high signal-to-noise ratios are achieved. Thus, the combination of oversampling and noise shaping technologies may be implemented using a sigma-delta DAC in order to achieve high resolution without external trimming. A high speed and high resolution digital-to-analog conversion solution, however, does not presently exist. A good overview of the theory of sigma-delta modulation is given in "Oversampling Delta-Sigma Data Converters," by Candy and Temes, IEEE Press, 1992. Examples of D/A converters utilizing delta-sigma modulation are given in U.S. Pat. Nos. 4,901,077; 5,079,551; 5,185,102; 5,313,205; 5,701,106; 5,712,635; 5,786,779; 5,920,273; and 5,952,947. The disclosures of the foregoing references are incorporated herein.

Specifically, sigma-delta DACs commonly include a front-end interpolator which receives digital input samples and increases the sampling rate (typically 64–256 times the input sample rate) of the digital input samples. Techniques for increasing the sample rate, generally called interpolation, are well understood by those skilled in the art. Most designs utilize several stages of increase. A sigma-delta modulator receives the higher frequency input samples from the interpolator and converts the samples to a lower resolution (typical one-bit), high frequency bit stream. Rather than spreading quantization noise uniformly over the frequency range from 0 to the sampling Nyquist frequency, the sigma delta modulator shapes the noise so that the majority of the noise falls into the very high frequencies above the Nyquist frequency. Thus, it effectively removes the noise from the lower frequency range which is of interest for the particular applications cited above.

An oversampling DAC which utilizes a second order sigma-delta quantizer and an analog low pass filter to convert the data from the sigma-delta quantizer to analog signal is a very effective device for low speed audio applications. This implementation, however, is inappropriate for high speed applications such as the cellar base station of the aforementioned criteria. In addition, this type of DAC has a relatively high output data transition rate, requiring higher power than is desirable. Moreover, considering oversampling interpolations on the order of n=256 for high sampling rates, such as the 400M samples/sec required for cellular base station applications, extreme clocking speeds (400 MHz×256) become a serious design obstacle.

Thus, there exists a need for an improved cellular base station having a DAC operable at higher speed than heretofore achievable which exploits the sigma-delta principle in a different way.

SUMMARY OF THE INVENTION

The invention comprises a digital cellular base station that utilizes a high speed, high resolution digital-to-analog converter. Use of high speed, high resolution, digital-to-analog converters (DACs) significantly reduces hardware requirements for a digital cellular base station. The high-speed, high resolution digital-to-analog converter of the present invention includes a storage means for storing delta-sigma bit sequences corresponding to all possible values of a digital input coupled to a plurality of one-bit digital to analog converters. Each of the digital to analog converters are clocked by multi-phase clocks such that each phase applied to each one of the digital to analog converter is delayed with respect to a next one by the oversampling period, which is the Nyquist period divided by the number of predetermined interpolated samples. An analog summer is coupled to all the digital-to-analog converters for summing all the outputs from the plurality of digital to analog converters to generate an analog output. Incorporation of the high-speed, high resolution digital-to-analog converter reduces the amount of hardware necessary for cellular base-stations.

BRIEF DESCRIPTION OF THE DRAWINGS

For a more complete understanding of the present invention and the advantages thereof, reference is now made to the following description taken in conjunction with the accompanying drawings in which like reference numbers indicate like features and wherein:

FIG. 1 illustrates a block diagram of a prior art base station;

FIGS. 2a–2c illustrate the output frequencies of power amplifiers 22a, 22b and 22c, respectively;

FIG. 15 illustrates a spectral definition of 2G and 3G cellular regulations.

DETAILED DESCRIPTION OF PREFERRED EMBODIMENTS

Figure 3:
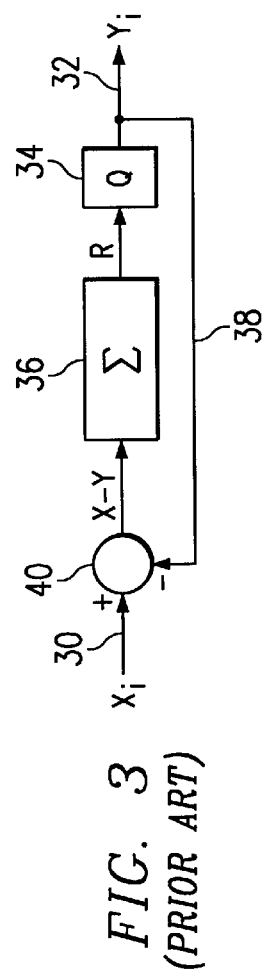
FIG. 3 is a schematic of a known first order sigma-delta converter.

The present invention is best understood by comparison with the prior art. Hence, this detailed description begins with a discussion of a prior art base station. FIG. 1 illustrates a block diagram of a prior art base station 10. Base station 10 comprises a data input 12a (typically the input is from a traditional telephone line). Data input 12a is coupled to a respective digital signal processor (DSP) baseband processor 14a. A low speed digital-to-analog converter 16a couples DSP 14a to a modulator 18a. An up converter 20a couples modulator 18a to a power amplifier 22a. A combiner 24 couples power amplifier 22a to a sector antenna 26. Input data, typically from a traditional telephone line, is digitally processed by digital signal processor (DSP) 14a. The digitally processed signal is forwarded to digital-to-analog converter 16a, where the processed signal is changed from digital to analog. The analog signal is modulated by modulator 18a after which its frequency is up converted in up converter 20a. The up converted signal is forwarded to power amplifier 22a where it is amplified and forwarded onto combiner 24 (where it is combined with any other signals to be transmitted), and radiated out on antenna 26.

To accommodate the need to process and transmit more than one data input simultaneously, additional hardware is required to overcome the low speed capability of digital-to-analog converter (DAC) 16a. A second data input 12b is coupled to a second respective digital signal processor (DSP) baseband processor 14b. A second low speed digital-to-analog converter 16b couples DSP 14b to a second modulator 18b. A second up converter 20b couples modulator 18b to a second power amplifier 22b. A combiner 24 couples power amplifier 22b to sector antenna 26. Combiner 24 combines any signal to be transmitted from power amplifier 22b with any from power amplifier 22b. If needed, a third data input 12c is coupled to a third respective digital signal processor (DSP) baseband processor 14c. A third low speed digital-to-analog converter 16c couples DSP 14c to a third modulator 18c. A third up converter 20c couples modulator 18c to a third power amplifier 22c. A combiner 24 couples power amplifier 22c to sector antenna 26. Combiner 24 combines any signal to be transmitted from 22c with any from power amplifier 22b and any from power amplifier 22a. The concept is expandable as needed, for example, data input 12n is coupled to a respective digital signal processor (DSP) baseband processor 14n. A low speed digital-to-analog converter 16n couples DSP 14n to a modulator 18n. An up converter 20n couples modulator 18n to a power amplifier 22n. A combiner 24 couples power amplifier 22n to sector antenna 26 and combines any signals from power amplifier 22a–22n.

FIG. 2a illustrates a graph of the frequency of the signal outputted by power amplifier 22a. FIG. 2b illustrates a graph of the frequency of the signal outputted by power amplifier 22b. FIG. 2c illustrates a graph of the frequency of the signal outputted by power amplifier 22c.

A significant disadvantage of the above-described prior art base station is need to provide significant additional hardware to handle more than one data input. More specifically, the problem in handling additional data is tied directly to the low speed capability of the low speed, high resolution digital-to-analog converter (16a–16n), which use well-known first order sigma-delta quantizers. A well-known first order sigma-delta quantizer, as shown in FIG. 3. The purpose of this quantizer in a D/A converter is to convert a high-resolution digital signal $x_i$, 30, having several bits (16, for example) into a single-bit code $y_i$, 32, which can be accurately converted to analog. Input 30 is fed to the quantizer 34 via an integrator 36, and quantized output 32 is fed back as feedback 38 and subtracted using adder 40 from the input. Quantizer 34 generates a 1-bit output depending upon whether the output of the integrator is positive or negative. The quantizer function is modeled as adding the output of integrator 36 to an error signal $e_i$ (not shown). This modeling allows the calculation of the spectrum of the noise to be done in a straightforward manner.

For large positive inputs, the integrator output will be positive. A logic one is then the output of the quantizer, which is fed back and subtracted from the input. The series of output ones continues until the integrator output, which is ramping down due to the negative feedback, finally crosses the quantizer threshold, at which point the quantizer outputs a negative one. Over time, the average output $y_i$ equals the input $x_i$. The system is called a first order sigma-delta converter, because a single integrator stage is used.

Figure 4:
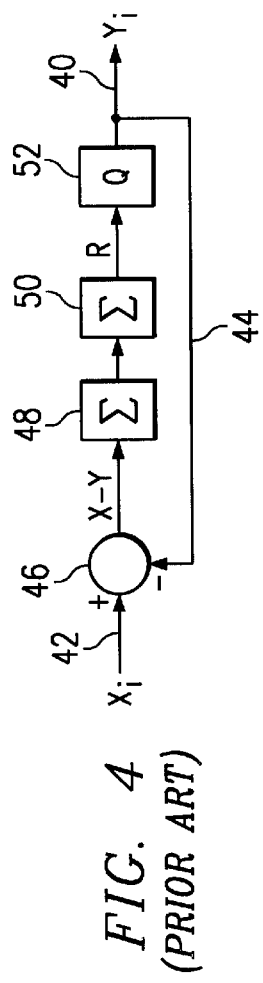
FIG. 4 is a schematic of a known second order sigma-delta converter.

FIG. 4 shows a common second order sigma-delta quantizer. In many D/A conversion applications, sigma-delta modulators are chosen to be at least second order because higher order modulators better reduce noise in the signal band, due to improved prediction of the in-band quantization error. Thus, the resulting signal-to-noise ratio is better. Second order sigma-delta modulators are still relatively stable and easy to design. However, third and higher order modulator design can become quite complex.

For the quantizer of FIG. 4, input $x_i$, 42, is added to feedback signal 44 by adder 46. The signal from adder 46 is fed into first accumulator 48. The output of accumulator 48 is fed into second accumulator 50. The output of accumulator 50 goes into quantizer 52. The residue or error signal $e_i$ (not shown) is added to the input $x_i$ by adder 46. The quantized output from quantizer 52 is fed back as feedback signal 44. Quantizer 52 may quantize the signal into ones and zeroes (1-bit format) or into multiple levels.

For simplicity, oversampling by repeating the input data at higher frequencies is considered. The analysis of a delta-sigma loop with constant input is simple. It can be assumed that the residue R output of the integrator 36 in FIG. 1 remains bounded to a small value (denoted by $\epsilon$ because of the negative feedback around the loop). The residue R is equal to the error in the input sequence $x_i$ minus the output sequence $y_i$, as follows:

$$\Sigma(x_i - y_i) = R \rightarrow \epsilon$$

For n times oversampling using repetition of the input data n times between Nyquist samples, since $x_i$ is constant for the n iterations, after n iterations of the loop, this error reduces to $\epsilon/n$.

$$\Sigma x_i \cdot \Sigma y_i = \epsilon$$

$$n\Sigma x \cdot \Sigma y_i = \epsilon$$

$$x = (1/n)\Sigma y_i + (1/n)\epsilon$$

In a second order loop, there are two integrators in tandem. The input gets accumulated as x, 2x, 3x, . . . nx in the first integrator. In turn, the second integrator will contain as x, 3x, 6x, . . . n(n+1)x/2 due to the input samples alone. Thus, the error goes own in a quadratic fashion as $2/(n^2+n)$.

$$\Sigma\Sigma x_i \cdot \Sigma\Sigma y_i = \epsilon$$

$$\{n(n-1)/2\}\Sigma\Sigma x \cdot \Sigma\Sigma y_i = \epsilon$$

$$x = (2/(n^2+n))\Sigma\Sigma y_i + (2/(n^2+n))\epsilon$$

In other words, by increasing the order of the loop or n, one can make the error negligibly small as the stored value grows in proportion to n.

As disclosed in U.S. Pat. No. 5,815,102, which is incorporated by reference herein, FIG. 3 shows an oversampling D/A converter which utilizes a second order sigma-delta quantizer 70 and a one-bit D/A converter 71 as the demodulator 69, and a low pass filter 73 to remove the noise from the 1-bit signal. Oversampling is used to increase resolution by reducing quantization error to a small value. Techniques for increasing the sample rate, generally called interpolation, are well understood by those versed in the art. Typical techniques, among many, include zero stuffing and data repetition.

In FIG. 3, the input signal $x_i$, 60, consists of data encoded into 16-bit words at 8 kHz. These words are placed into a register 62 from which they are fed into a low pass filter 64 at 32 kHz, with each word repeated four times. The low pass filter is of the finite impulse response type. The linear interpolator 66, which is also a low pass filter, inserts three new words between each pair of words from low pass filter 64, which raises the data rate to 128 kHz. These words are fed into a second register 68, which feeds each word into the demodulator 70, repeating each word eight times, resulting in a data rate of 1 MHz. This repeating of the samples is a simple type of low pass filter. The 1 MHz sample rate is a sufficiently high data rate for audio applications so that the quantization noise which will be introduced into the signal is small, and the requirements of the analog smoothing filter are easily met. Output $y_i$, 72, is an analog signal. For audio applications, the output of demodulator 70 can sometimes be driven directly into a speaker, because the speaker can act as a low pass filter. This configuration uses what is called class D output or pulse density modulation drive. Power dissipation in a class D stage has the potential for being very low, as the output transistors are always in either a fully shorted or open position, removing most resistive power consumption.

Figure 5:
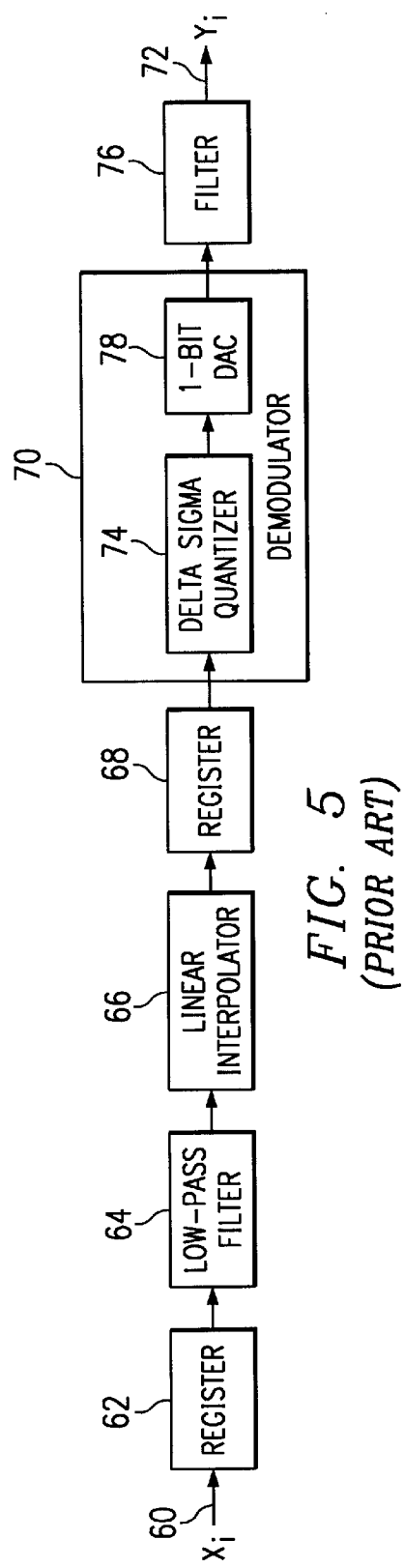
FIG. 5 shows a known over-sampling DAC system having the known first order sigma-delta converter of FIG. 1.

An oversampling D/A converter like that of FIG. 5, which utilizes a second order sigma-delta quantizer 74, and a low pass filter 76 to convert the data from the sigma-delta quantizer 74 to analog signal $y_i$, 72, is a very effective device for low speed sampling such as for low speed audio applications. However, it has a relatively high output data transition rate, requiring higher power than is desirable. Moreover, at high speed sampling rates, such as the, for example, 200 MHz sampling required for cellular base station applications, and oversampling interpolations on the order of n=256 times oversampling, extreme clocking speeds (400 MHz×256) becomes a serious design obstacle.

Figure 6:
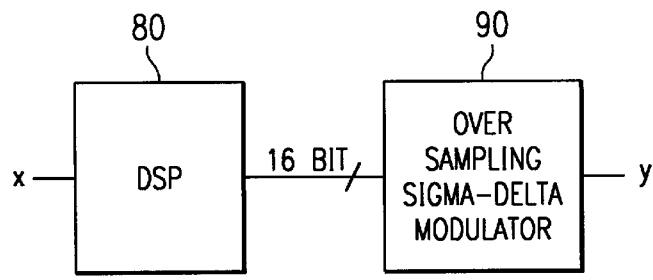
FIG. 6 illustrates the prior art digital signal processor and DAC arrangement.

Oversampling may be achieved by any given interpolation procedure. For example, where over-sampling is performed on a sample which is held constant for a whole Nyquist period, the interpolation reduces to repeating the input sample value n-times where n is the oversampling ratio. A sample and hold operation results in a low-pass filtering function and this is the well known (sinX)/X function. FIG. 6 shows a known implementation using a digital signal processor 80 coupled to oversampling sigma-delta modulator 90. The digital signal processor calculates the sequence values with the incoming signal in real time and the sigma-delta converter operates at oversampling rate. This, however, turns out to be an unnecessary and power-hungry operation.

Figure 7:
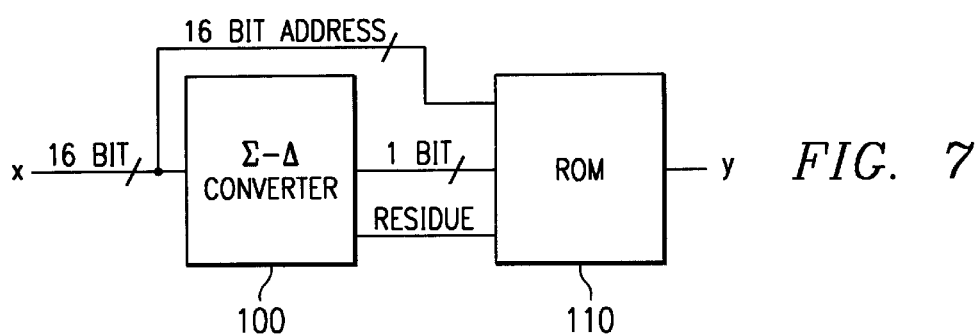
FIG. 7 illustrates a first order sigma-delta converter coupled to a read only memory to program.

FIG. 7 illustrates the apparatus used which provides off-line processing of output sequences in accordance with the present invention. A 16-bit input word is received by a sigma-delta converter 100 that is coupled to a read-only memory 110. The input signal and the output signal of the sigma-delta converter 100 are coupled to the read-only memory 110 to be stored as a table. In operation, sigma delta conversion is pre-calculated off-line to generate the output sequence as ell as residue if not negligible. This becomes possible since the conversion of one value of the signal is independent of the previous history of the inputs. Thus, the 65,536 values corresponding to all possible 16-bit inputs can be fed on a one-at-a-time basis into the off-line sigma-delta converter. The converter runs for n cycles where n is the oversampling factor. The output sequence of n bits and residue obtained from this off-line computation are stored in a read-only memory 110 addressable by a 16-bit input word.

Figure 8:
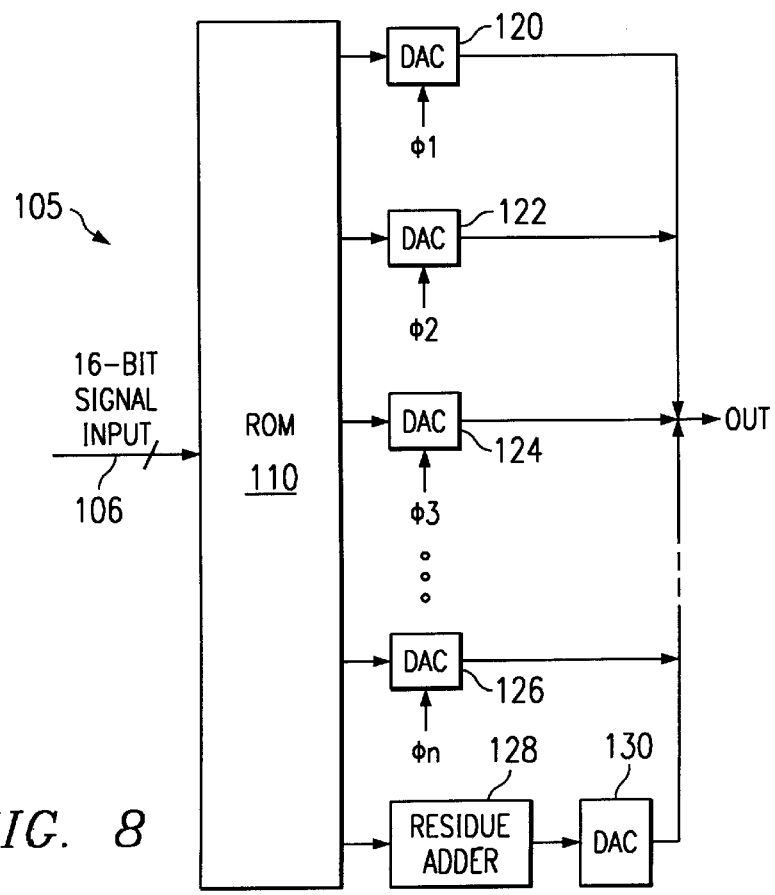
FIG. 8 illustrates an embodiment of a sigma-delta modulator as disclosed in one embodiment of the present invention.

FIG. 8 displays a high speed, high-resolution digital-to-analog converter 105 in accordance with the present invention. A 16-bit input word at the input signal 106 addresses the read-only memory 110 of FIG. 7 that contains the pre-computed delta-sigma values corresponding to all possible 16-bit inputs. The values stored in the read-only memory 110 when addressed by the input signal 106 will output all the stored values of the sigma delta sequence simultaneously. The output can be converted to the required analog signal by using a plurality of one bit digital to analog converters (DACs) 120, 122, 124 and 126 coupled to the n outputs of ROM 110, each clocked by multi-phase clocks each delayed with respect to the next by the oversampling period. The data stored in ROM 110 is compressed if necessary to minimize the number of storage cells or size of the ROM 110. Depending upon what is stored in ROM 110, the data output from the ROM 110 may be in variety of useful, low transition rate formats.

Figure 9:
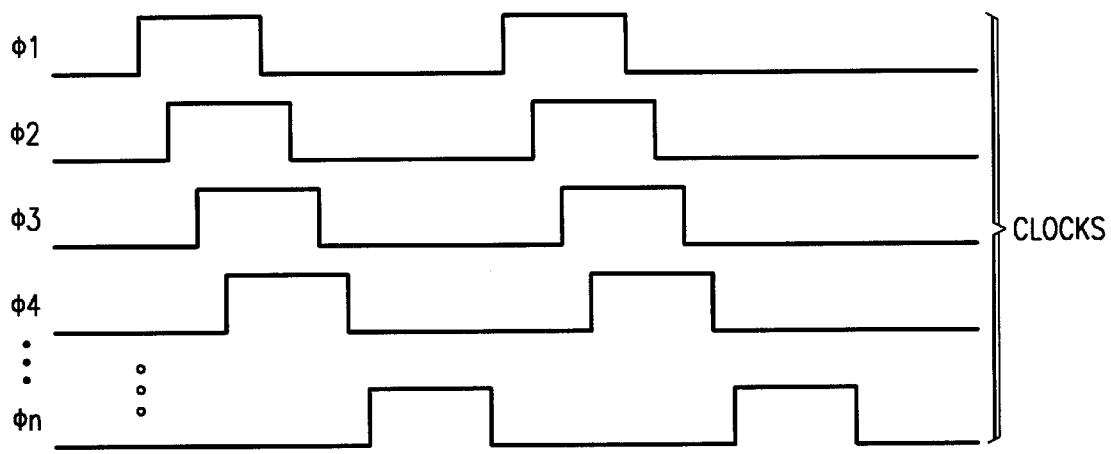
FIG. 9 shows the timing diagram of the clocking signals for each one-bit DAC in the sigma-delta modulator in accordance with the present invention.

Given a delay-lock loop and n one-bit DAC's 120, 122, 124 and 126, when the memory is addressed by an input, the whole stored bit-sequence as well as the residue is transferred to the output simultaneously. The sequence is stored as a column, these bits are fed to the DAC's 120, 122, 124 and 126 in parallel as shown. Each DAC 120, 122, 124 and 126 may be implemented using a current steering arrangement having a single differential pair and a tail current source. Each differential pair is switched by a clocked flip-flop thereby transferring current from one side to the other. The DAC's 120, 122, 124 and 126 are clocked with delayed clocks shown in FIG. 9. The delay between adjacent clocks is the T/n where T is the Nyquist period. This multi-phase clock must be obtained using a delay-lock loop with very low jitter. For improved accuracy reasons, if stored residues are outputted, a separate residue adder 128 and DAC 130 will be necessary. These values will be added in the digital domain. Only when the value of the residue becomes appreciable (i.e. when the most significant bit becomes one) will it be converted to analog and added to the output as a correction.

The analog output obtained by summing all the DAC 120, 122, 124 and 126 outputs then emulates a sigma-delta DAC yet this embodiment provides both high speed and high resolution not possible by prior art sigma-delta solutions. Note that this output has shaped quantization-noise at high frequencies above the oversampling rate that must be filtered out. A convenient way to do this, as disclosed in U.S. Pat. No. 5,012,245 (which is incorporated herein), is to use an FIR filtering technique which is obtained simply by adjusting the tail currents of the various DAC's 120, 122, 124 and 126 to correspond to the coefficients of the filter. Multiplication is trivial when one of the operands is a+1, −1 or 0. Note that inaccuracies in coefficients of the filter will not introduce non-linearity or spurs but will only change the frequency response of the filter.

Another embodiment may include the incorporation of a second-order sigma-delta loop, to obtain 100 dB dynamic range, the oversampling ratio is 128. This means that the read-only store is 65 K×128 bits. If a higher order loop or a multi-bit delay loop is utilized, the oversampling ratio will be smaller; however, the DAC 105 becomes more complex although the number of DAC's 120, 122, 124 and 126 as well as the number of clock-phases reduces.

Still another embodiment may include an apparatus to apply the optimum number of taps and the tap weight coefficients of the filter. The method of designing the optimum number of taps and the tap weight coefficients as disclosed in U.S. Pat. No. 5,012,245 are incorporated herein. Specifically, these tap weight coefficients would be applied to the analog output signals from the DAC's 120, 122, 124 and 126.

Yet another embodiment may include a ROM such as the one in FIG. 7 where the data is compressed taking advantage of symmetry in the table and then stored. The data is later expanded by an expansion unit coupled to the output of the ROM after it leaves the ROM in FIG. 8. The corresponding expansion unit must be at a high speed as well.

A sub-assembly may be comprised solely of the ROM having the pre-stored sigma delta digital sequence for possible values of digital input.

Figure 10:
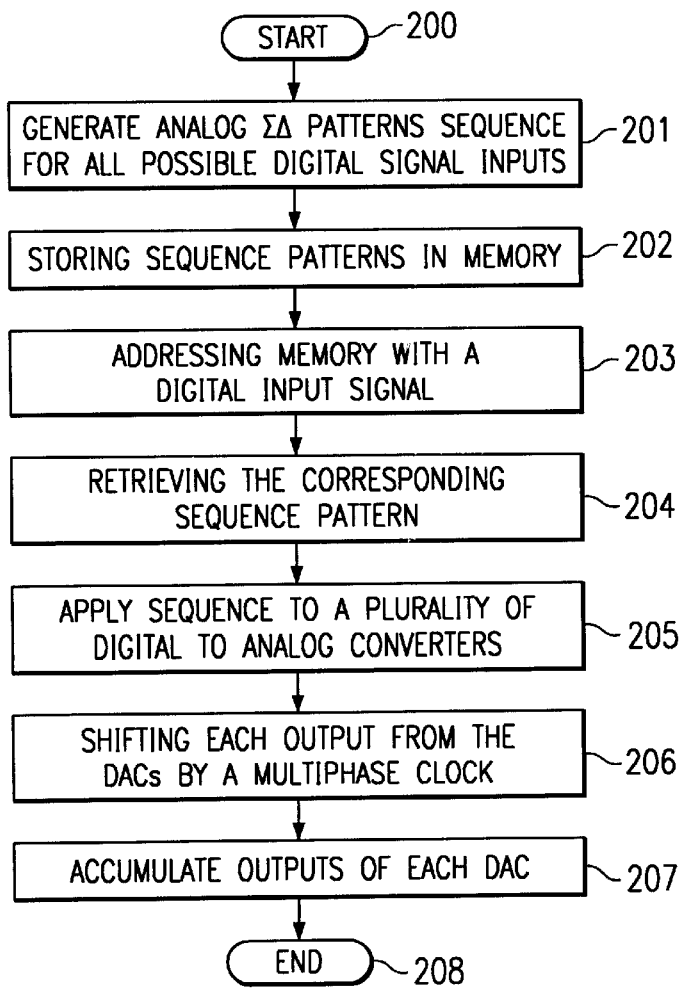
FIG. 10 displays a flow chart of the method of modulating a signal in accordance with the present invention.

A method of converting a digital signal to an analog signal having high speed and resolution is summarized in the flow chart of FIG. 10. At the start (step 200), sigma-delta analog sequence patterns are generated off-line for all possible digital signal inputs as shown in step 201. These sequence patterns are stored in a storage means such as a read-only memory in step 202. After a digital signal input addresses the read-only memory to retrieve the stored sequence pattern in step 203, the analog sequence pattern is retrieved in step 204. This data is applied to a plurality of digital-to-analog converters in step 205. In step 206, each of the plurality of digital-to-analog converters is clocked by a multiphase clock. All the outputs from each digital-to-analog converter are summed to present an output signal in step 207, which ends the process (step 208).

The high speed, high-resolution digital-to-analog converter of the present invention can be advantageously used in cellular base stations, and more particularly, cellular base stations operating according to international standards, such as for example CDMA (Code Division Multiple Access) and GSM (Global System for Mobile Communication).

Figure 11:
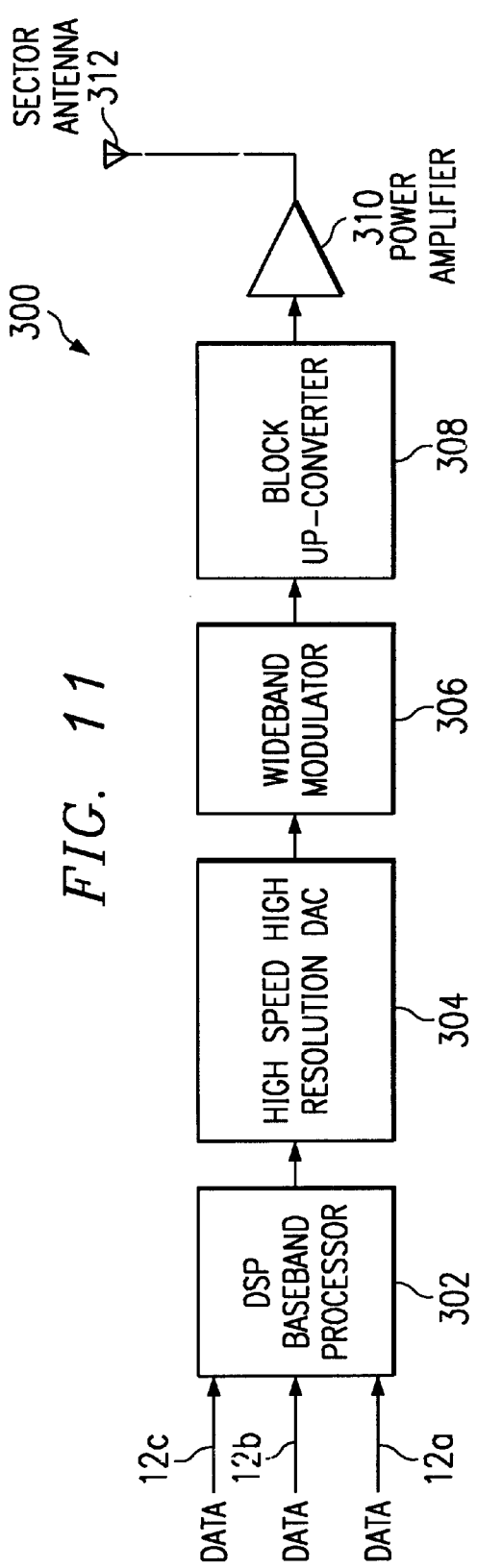
FIG. 11 illustrates a block diagram of base station according to a preferred embodiment of the present invention.
Figure 12:
FIG. 12a illustrates the output frequency of power amplifier 310 according to one embodiment of the invention.
FIG. 12b illustrates the output frequency of power amplifier 310 according to another embodiment of the invention.

FIG. 11 illustrates a cellular base station 300 that incorporates a high speed, high resolution digital-to-converter (DAC), according to a preferred embodiment of the invention. One or more data inputs (12a–12c being shown), each corresponding to a cellular channel, are coupled to DSP baseband processor 302. A high speed, high resolution digital-to-analog converter 304 couples DSP baseband processor 302 to a wideband modulator 306. A block up converter 308 couples wideband modulator 306 to a power amplifier 310 that is further coupled to a sector antenna 312 (while illustrated as a being a separate component in FIG. 11, block up converter 308 may also be implemented in wideband modulator 306). In operation, input data from multiple data inputs, typically representing voice or data channels, is digitally processed by digital signal processor (DSP) 302. The DSP may route the input data to individual frequency channel assignments. A high speed, high resolution, digital-to-analog converter (DAC) enables a system without channel filters. The composite digitally processed signal is forwarded to high speed, high resolution, digital-to-analog converter 304, where the processed signals are changed from digital to analog. The analog signals are modulated by wideband modulator 306 after which the spectrum may or may not be up converted in block up converter 310. The up converted signal is forwarded to power amplifier 310 where it is amplified and forwarded onto antenna 26 for radiating. The output frequency from power amplifier 310 is illustrated in FIG. 12.

Figure 13:
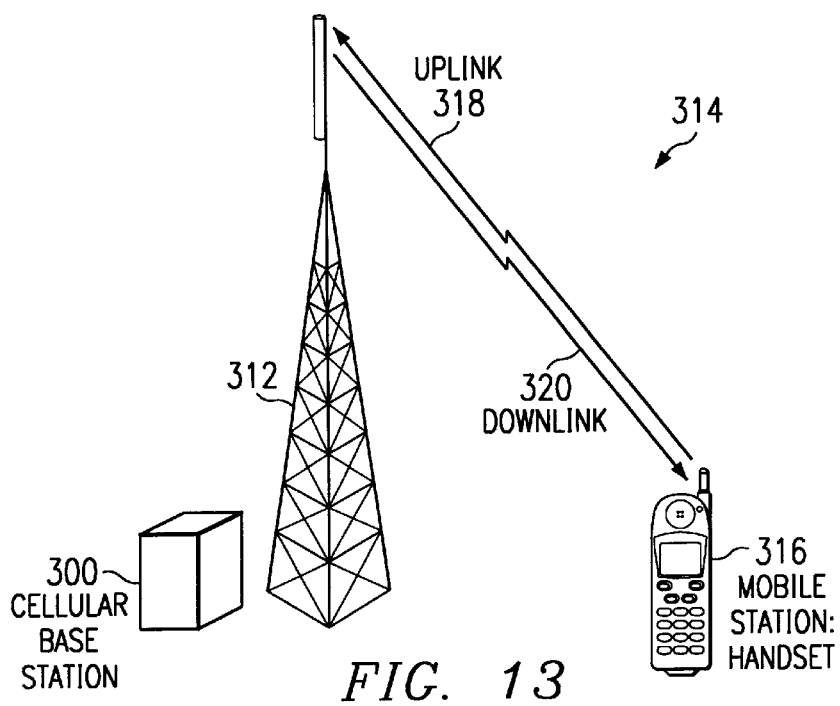
FIG. 13 illustrates a block diagram of a wireless communication system that implements the base station of an embodiment of the present invention.

FIG. 13 illustrates a wireless communication system in which the base station of the present invention may be implemented. Wireless communication system 314 comprises a wireless user terminal (a cellular handset being illustrated) 316 that communicates with a base station 300 over an uplink channel 318 and downlink channel 320. The base station and the wireless user terminal unit operate in a similar manner.

Cellular communication in system 314 can be facilitated in Time Domain Duplex (TDD) or in Frequency Domain Duplex (FDD). In Time Domain Duplex (TDD) the communication between wireless user terminal 316 and base station 300 is on a single channel. Much like a walky-talky, the channel is shared in time by the mobile station transmitter and the base station transmitter. A time slot is dedicated to the uplink and another timeslot is dedicated to a downlink. The relative length of the uplink and downlink time slots can be adjusted to accommodate asymmetric data traffic. If it is found that downlink data traffic is on average twice that of uplink, then the downlink time slot is twice as long as the uplink time slot. In Frequency Domain Duplex (FDD) the wireless user terminal 316 and the base station 300 communicate over a pair of radio frequencies. The lower frequency is the uplink during which the mobile station sends information to the base station. Both uplink and downlink are each composed of a signal source, a transmitter, the propagation path, a receiver and a method of presenting the information. Both wireless user terminal and base station embody the invention with transmitters, which convert digital data to analog signals at high speed and with high resolution. The base station could convert the entire multi-carrier downlink signal to analog for use in a single RF transmitter.

Figure 14A:
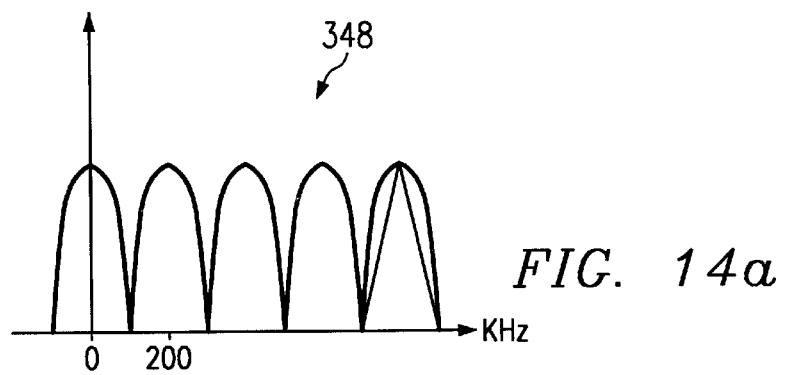
FIG. 14 illustrates the transmitted spectra for TDMA (GSM) and CDMA (IS-95) systems.
Figure 14B:
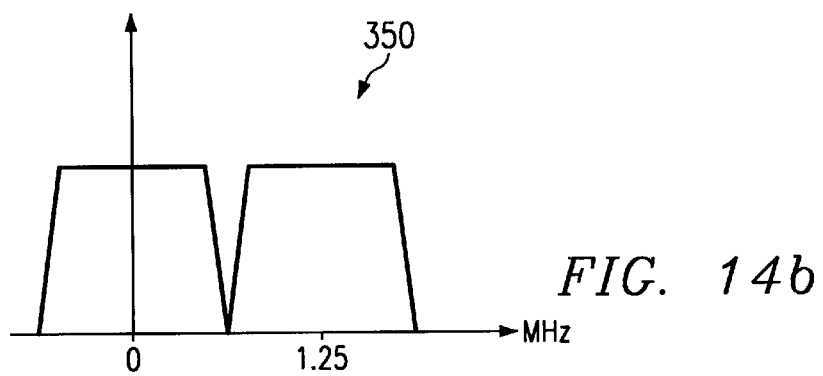

The band structure of the cellular system in which the communication system of the present invention operates is composed of tightly packed RF carriers with very high spectral density. As illustrated in FIG. 14, the world's most widely deployed TDMA system is GSM, where the GMSK-modulated carriers are placed on a 200-Khz raster 348 with adjacent channel signal interference suppressed to −30 dBc at the first adjacent channel and −60 dBc at the second. The 2-G CDMA system used in America (IS-95) uses QPSK-modulated (at 1.2288 Msps) carriers spaced at 1.25 Mhz 350 with very little guard band. Each carrier can be modulated with up to 32 Walsh codes, which are used to separate the users. As previously mentioned, using high speed, higher resolution digital-to-analog converters (DACs) disclosed in this invention, enables multi-carrier base station transmission through a common RF power amplifier.

FIG. 15 illustrates the spectral definition of the 2G and 3G cellular regulations. The base station transmitter operates on the upper frequency band. For example, in Europe the base station receives from 1900 to 1980 Mhz and transmits from 2110 to 2170 Mhz.

The terms and expressions which have been employed in the foregoing specification are used therein as terms of description and not of limitation, and there is no intention in the use of such terms and expressions of excluding equivalents of the features shown and described or portions thereof, it being recognized that the scope of the invention is defined and limited only by the claims which follow.

What is claimed:

1. A base station, comprising:
   a baseband processor having at least two data inputs;
   a high speed, high resolution, digital-to-analog converter (DAC) coupling said baseband processor to a modulator;
   an up-converter coupling said modulator to a power amplifier; and
   an antenna coupled to said power amplifier.

2. The base station of claim 1 wherein said baseband processor is a digital signal processor (DSP).

3. The base station of claim 1 wherein said modulator is a wideband modulator.

4. The base station of claim 1 wherein said up-converter is a block up-converter.

5. The base station of claim 1 wherein said data inputs receive data from plain old telephone lines (POTS).

6. The base station of claim 1 wherein said baseband processor processes and modulates the digital input signal.

7. The base station of claim 1 wherein said high speed, high resolution, digital-to-analog converter (DAC) converts the digital signal to an analog signal at an intermediate frequency.

8. The base station of claim 7 wherein said modulator modulates said analog signal.

9. The base station of claim 8 wherein said up-converter converts said modulated signal to a broadcast frequency.

10. The base station of claim 1 wherein said antenna is a sector antenna.

11. The base station of claim 1, wherein said baseband processor comprises:
   a storage means having stored outputs of a delta-sigma converter fed by a number of predetermined interpolated samples corresponding to all possible values of at least one of said data inputs; said storage means coupled to receive said data input;
   a plurality of digital-to-analog converters coupled to said storage means to receive said stored outputs, said plurality of digital-to-analog converters clocked by multi-phase clocks wherein each phase applied to each of said plurality of digital to analog converters is delayed with respect to a next one by an oversampling period equal to the Nyquist period divided by the number of predetermined interpolated samples; and
   a summer coupled to said plurality of digital-to-analog converters for summing all output from said plurality of digital-to-analog converters to generate said analog output.

12. The base station of claim 11 wherein said storage means is a read/write programmable memory.

13. The base station of claim 11 wherein said storage means is a read only memory.

14. The base station of claim 11 wherein said digital baseband further comprises:
   a digital signal processor (DSP);
   a microcontroller unit (MCU) coupled to said DSP; and
   an ASIC backplane coupled to said DSP and said MCU.

15. The base station of claim 1 wherein said analog baseband comprises an RF interface coupled to said DSP and to said RF section.

16. The base station of claim 1 wherein said base station is a cellular base station.

17. The base station of claim 1 wherein said baseband processor is a digital baseband processor.

18. The base station of claim 1 wherein said data inputs provide digital data.

19. The base station of claim 1 wherein said at least two data inputs receive input from Plain Old Telephone lines (POTS).

20. The base station of claim 1 wherein said base station simultaneously sends information from multiple inputs over an RF transmission.

21. The base station of claim 20 wherein said RF transmission is divided into multiple RF channels.

22. A base station, comprising:
   circuitry for providing a digital baseband function;
   circuitry, responsive to said digital baseband function, for providing a high speed, high resolution, digital-to-analog conversion function;
   circuitry, responsive to said high speed, high resolution, digital-to-analog conversion function, for modulating said converted analog signal;
   circuitry, responsive to said modulator function, for up-converting said modulated and converted analog signal to a broad cast frequency; and
   circuitry, responsive to said being responsive to said up-converting function, for amplifying said up-converted signal and coupling said amplified signal to an antenna.

23. The base station of claim 22, wherein said circuitry for providing a digital baseband function receives information from at least two data inputs.

24. The base station of claim 22, wherein said information from said at least two data inputs is capable of being received simultaneously.

* * * * *